(12) United States Patent
Yamada et al.

(10) Patent No.: US 9,294,598 B2
(45) Date of Patent: *Mar. 22, 2016

(54) SWITCH CIRCUIT

(75) Inventors: Kouichi Yamada, Gifu-ken (JP); Hajime Mizukami, Gifu (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 756 days.

This patent is subject to a terminal disclaimer.

(21) Appl. No.: 13/219,205

(22) Filed: Aug. 26, 2011

(65) Prior Publication Data

US 2012/0056660 A1    Mar. 8, 2012

(30) Foreign Application Priority Data

Aug. 27, 2010 (JP) ................................. 2010-190822

(51) Int. Cl.
*H02B 1/00* (2006.01)
*H04B 3/00* (2006.01)
*H03K 17/00* (2006.01)
(Continued)

(52) U.S. Cl.
CPC ......... *H04M 1/0274* (2013.01); *H03K 17/6874* (2013.01); *H03K 2217/0054* (2013.01)

(58) Field of Classification Search
CPC .............. H03K 17/002; H03K 17/693; H03K 17/6874; H03K 2217/0054; H04H 60/04; H04H 20/83; H04R 5/04; H04R 27/00; H04M 1/0274
USPC ............. 381/81, 123, 85, 94.5, 100; 439/577, 439/669; 455/575.2; 327/407, 408
See application file for complete search history.

(56) References Cited

U.S. PATENT DOCUMENTS 6,462,611 B2 * 10/2002 Shigehara et al. ............ 327/534
7,602,229 B2   10/2009 Tolle et al.
(Continued)

FOREIGN PATENT DOCUMENTS

JP    05-327436 A    12/1993
JP    2006-108567 A   4/2006
(Continued)

OTHER PUBLICATIONS

ITM, IMD18N30, Feb. 2010, p. 1.*
(Continued)

*Primary Examiner* — Vivian Chin
*Assistant Examiner* — William A Jerez Lora

(57) ABSTRACT

A signal line from a common terminal, which allows the insertion of a terminal of a cable for transmitting high-frequency signals or the insertion of a terminal of a cable dedicated to the transmission of audio signals, is branched into one line which is connected to one end of a high-frequency signal switch (USB switch) and the other line which is connected to one end of an audio signal switch (audio switch), respectively. A signal line from the other end of the high-frequency signal switch is connected to a target circuit. A signal line from the other end of the audio signal switch in a primary hierarchical position is branched into a plurality of lines, and the respective plurality of lines are connected to one end of audio signal switches (e.g., headphone switch and microphone switch) in a secondary hierarchical position. And the respective signal lines from the other end of the plurality of audio signal switches of secondary hierarchical position are connected to respective target circuits.

19 Claims, 8 Drawing Sheets

(51) Int. Cl.
  *H04M 1/02* (2006.01)
  *H03K 17/687* (2006.01)

(56) References Cited

U.S. PATENT DOCUMENTS

| | | | |
|---|---|---|---|
| 7,930,644 B2 | 4/2011 | Silva et al. | |
| 2007/0132501 A1* | 6/2007 | Koch et al. | 327/407 |
| 2008/0197923 A1 | 8/2008 | Nakajima et al. | |
| 2008/0316076 A1* | 12/2008 | Dent et al. | 341/144 |
| 2010/0122310 A1* | 5/2010 | Chozui | 725/139 |
| 2010/0207579 A1* | 8/2010 | Lee et al. | 320/120 |

FOREIGN PATENT DOCUMENTS

| | | | |
|---|---|---|---|
| JP | 2008-205794 A | | 9/2008 |
| JP | 2010-136388 | * | 6/2010 |
| JP | 2010-166793 A | | 7/2010 |
| JP | 2010-171589 A | | 8/2010 |

OTHER PUBLICATIONS

Japanese Office Action issued in corresponding Japanese Application No. 2010-194506, dated Nov. 12, 2013, with English translation.
Actions on the Merits for Copending U.S. Appl. No. 13/221,523, filed Aug. 30, 2011.

* cited by examiner

SWITCH CIRCUIT

CROSS-REFERENCE TO RELATED, COPENDING APPLICATION

Related subject matter is found in copending patent application Ser. No. 13/221,523, entitled "Bidirectional Switch and Switch Circuit using the Bidirectional Switch," invented by Kouichi Yamada, filed Aug. 30, 2011 and assigned to the assignee hereof.

CROSS-REFERENCE TO RELATED APPLICATIONS

This application is based upon and claims the benefit of priority from the prior Japanese Patent Application No. 2010-190822, filed on Aug. 27, 2010, the entire content is incorporated herein by reference.

BACKGROUND OF THE INVENTION

1. Field of the Invention

The present invention relates to a switch circuit to be installed within a host device.

2. Description of the Related Art

USB (Universal Serial Bus) is today in widespread use as a standard for connecting a computer with peripheral devices. USB is widely incorporated in stationary equipment, such as PCs, and also in mobile devices, such as mobile phones, smartphones, digital cameras, portable music players, game devices, and IC recorders.

These mobile devices are provided not only with USB terminals (ports) but also with terminals (ports) for insertion of headphone terminals or earphone terminals (both hereinafter collectively referred to as "headphone terminal") and those for insertion of hands-free microphones or recording microphones (hereinafter referred to as "microphone terminal"). To achieve downsizing or better design for such mobile devices, there have been proposals aiming for the use of a single common terminal (port) for the group of these terminals.

As a transistor for switching the analog audio signals passing through a headphone terminal or a microphone terminal, it is necessary that a transistor of low on-resistance of about several ohms be used. That is, the size of the transistor must be large. More specifically, the transistor must be of such design as to have a large gate width (GW) (i.e., a large diffusion layer).

On the other hand, it is known that the USB2.0 standard supports high-speed-mode transmission. In the high speed mode, large-volume data, such as video data, can be transmitted at high speed, namely, at a maximum bit rate of 480 Mbps. In order to switch high-frequency signals at such high speed, it is necessary that the load capacity at the common terminal for a group of terminals be as small as practicable. Large load capacities can dull rising edges and falling edges. That is, for the switching of high-frequency signals, the load capacity must be as small as practicable.

As described above, when a common terminal is used in the place of a USB terminal and a headphone terminal, a signal line is branched into a signal line for USB and a signal line for the headphone. And the high-frequency signals passing through the signal line for USB are more susceptible to distortion because of the capacity of the transistor switch inserted in the signal line for the headphone. The greater the number of signal lines for the transmission of analog audio signals to be branched off from the signal line for USB is, the greater this effect will be.

SUMMARY OF THE INVENTION

A switch circuit according to one embodiment of the present invention is a switch circuit to be mounted in a device having a common terminal which allows insertion of a terminal of a cable for transmitting high-frequency signals and insertion of a terminal of a cable dedicated to the transmission of audio signals, and the switch circuit includes: a high-frequency signal switch capable of switching between passage and no passage of high-frequency signals; and an audio signal switch dedicated to switching between passage and no passage of audio signals. A signal line from the common terminal is branched into one line connected to one end of the high-frequency signal switch and the other line connected to one end of an audio signal switch in a primary hierarchical position; a signal line from the other end of the high-frequency signal switch is connected to a target circuit; a signal line from the other end of the audio signal switch in the primary hierarchical position is branched into a plurality of lines, the respective lines connected to one end of a plurality of audio signal switches in a secondary hierarchical position, and respective signal lines from the other end of the plurality of audio signal switches in the secondary hierarchical position are connected to respective target circuits.

BRIEF DESCRIPTION OF THE DRAWINGS

Embodiments will now be described by way of examples only, with reference to the accompanying drawings which are meant to be exemplary, not limiting, and wherein like elements are numbered alike in several Figures in which.

DETAILED DESCRIPTION OF THE INVENTION

The invention will now be described by reference to the preferred embodiments. This does not intend to limit the scope of the present invention, but to exemplify the invention.

Figure 1A:
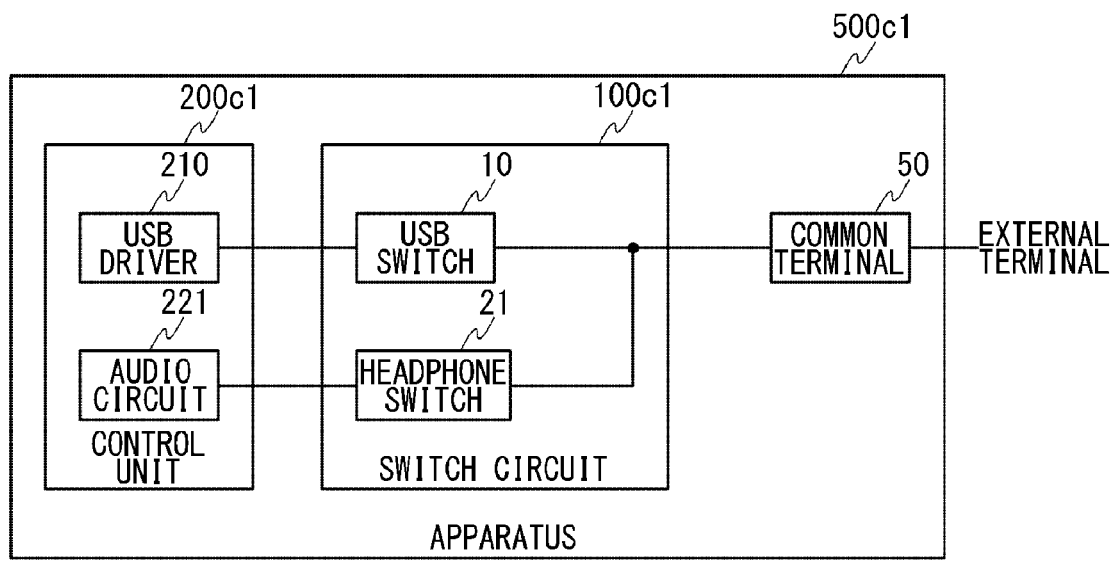
FIGS. 1A and 1B are block diagrams for use in explaining switch circuits that are to be compared with switch circuits according to an embodiment of the present invention.
Figure 1B:
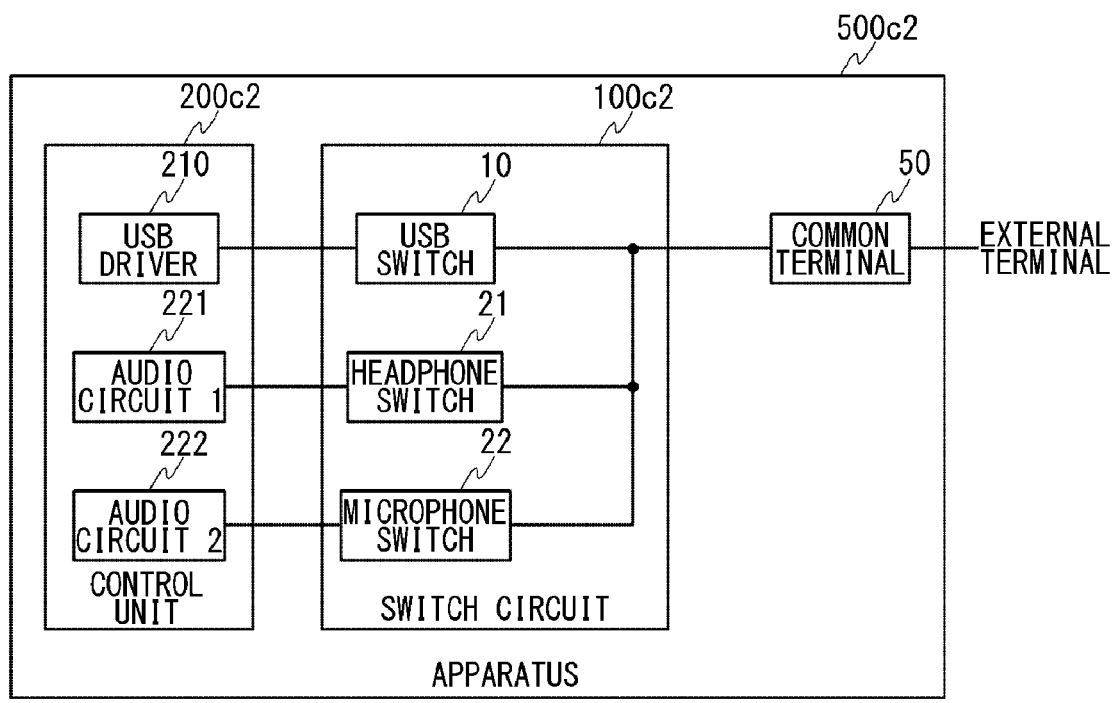

FIGS. 1A and 1B are block diagrams for use in explaining switch circuits that are to be compared with switch circuits according to an embodiment of the present invention. FIG. 1A is a block diagram for explaining a switch circuit 100c1 of comparative example 1. Note that, in this patent specification herein, a mobile phone is assumed as an apparatus 500c1. The apparatus 500c1 includes a control unit 200c1, a switch circuit 100c1, and a common terminal (port) 50. The control unit 200c1 includes a USB driver 210 and an audio circuit 221. The switch circuit 100c1 includes a USB switch 10 and a headphone switch 21.

The common terminal 50 allows insertion of a terminal of a cable for transmission of high-frequency signals (e.g., terminal of a USB cable) or insertion of a terminal of a cable dedicated to the transmission of audio signals (e.g., terminal of a headphone cable) in a shared manner.

Hereinbelow in this specification, the D− terminal and D+ terminal of a USB connector will be used as examples of the common terminal 50. In addition to these terminals, the USB connector has a supply terminal and a ground terminal, thus having a total of four pins. Also, a micro USB connector, which is further provided with an ID terminal, has a total of five pins. The ID terminal can also be used as the common terminal 50.

The switch circuit 100c1 is provided with a high-frequency signal switch capable of switching between passage and no passage of high-frequency signals and an audio signal switch dedicated to switching between passage and no passage of audio signals. In this specification, a description will be given of an example in which the high-frequency signal switch and the audio signal switch are each constructed of MOSFETs (metal-oxide-semiconductor field-effect transistors). As mentioned already, it is necessary that the audio signal switch be constructed of transistors whose size is larger than the transistors constituting the high-frequency signal switch.

In FIG. 1A, the USB switch 10 is equal to the high-frequency signal switch, and the headphone switch 21 is equal to the audio signal switch. It is to be noted also that the microphone switch 22 in FIG. 1B, the audio switch 20 in FIG. 2, and the microphone switch 23 in FIG. 3 are all equal to the audio signal switch.

A signal line from the common terminal 50 is branched into one line which is connected to one end of the USB switch 10 and the other line which is connected to one end of headphone switch 21. A signal line from the other end of the USB switch 10 is connected to a USB driver 210 which is a target circuit. And a signal line from the other end of the headphone switch 21 is connected to the audio circuit 221 which is a target circuit.

FIG. 1B is a block diagram for explaining a switch circuit 100c2 of comparative example 2. The apparatus 500c2 includes a control unit 200c2, a switch circuit 100c2, and a common terminal 50. The control unit 200c2 includes a USB driver 210, an audio circuit 1 (221), and an audio circuit 2 (222). The switch circuit 100c2 includes a USB switch 10, a headphone switch 21, and a microphone switch 22.

The common terminal 50 allows the insertion of a terminal of a USB cable, a terminal of a headphone cable, or a terminal of a microphone cable in a shared manner. A signal line from the common terminal 50 is branched into three lines which are connected to one end of the USB switch 10, one end of the headphone switch 21, and one end of the microphone switch 22, respectively. A signal line from the other end of the USB switch 10 is connected to the USB driver 210. A signal line from the other end of the headphone switch 21 is connected to the audio circuit 1 (221). And a signal line from the other end of the microphone switch 22 is connected to the audio circuit 2 (222).

If the MOSFETs constituting the headphone switch 21 and the MOSFETs constituting the microphone switch 22 are of the same size, the capacity as seen from the signal line for USB in the switch circuit 100c2 of comparative example 2 is twice as large as that in the switch circuit 100c1 of comparative example 1. In this case, the waveform (eye pattern waveform) of high-frequency signals passing through the USB switch 10 will be inferior.

Also, if the MOSFETs constituting the headphone switch 21 and the MOSFETs constituting the microphone switch 22 are both halved in size in order to retain the normal waveform of the high-frequency signals, the total harmonic distortion (THD) of the audio signals passing through the headphone switch 21 and the microphone switch 22 respectively will be nearly doubled.

Figure 2:
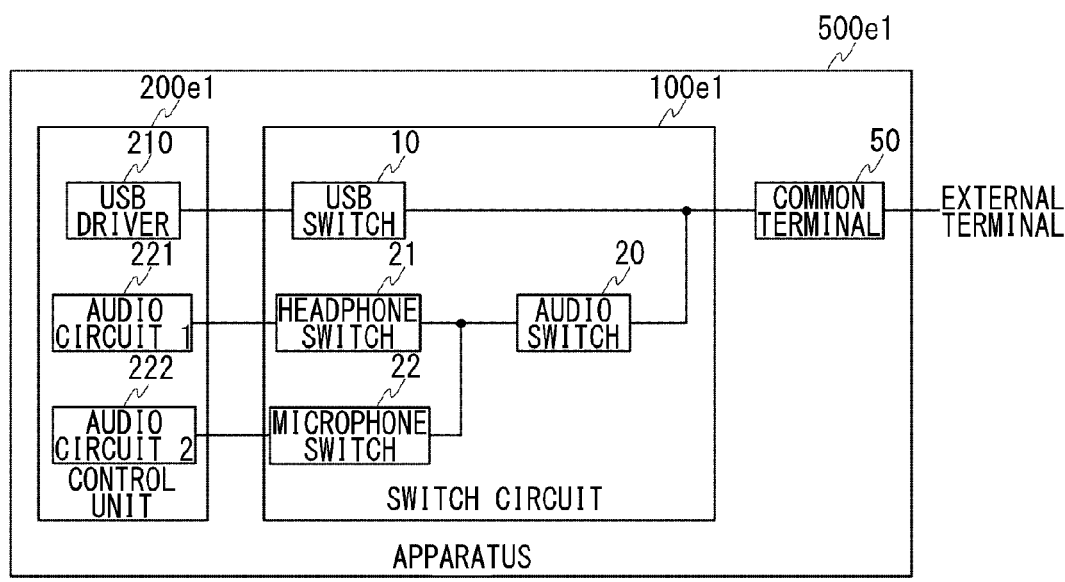
FIG. 2 is a block diagram for explaining a switch circuit according to a first embodiment of the present invention.
Figure 3:
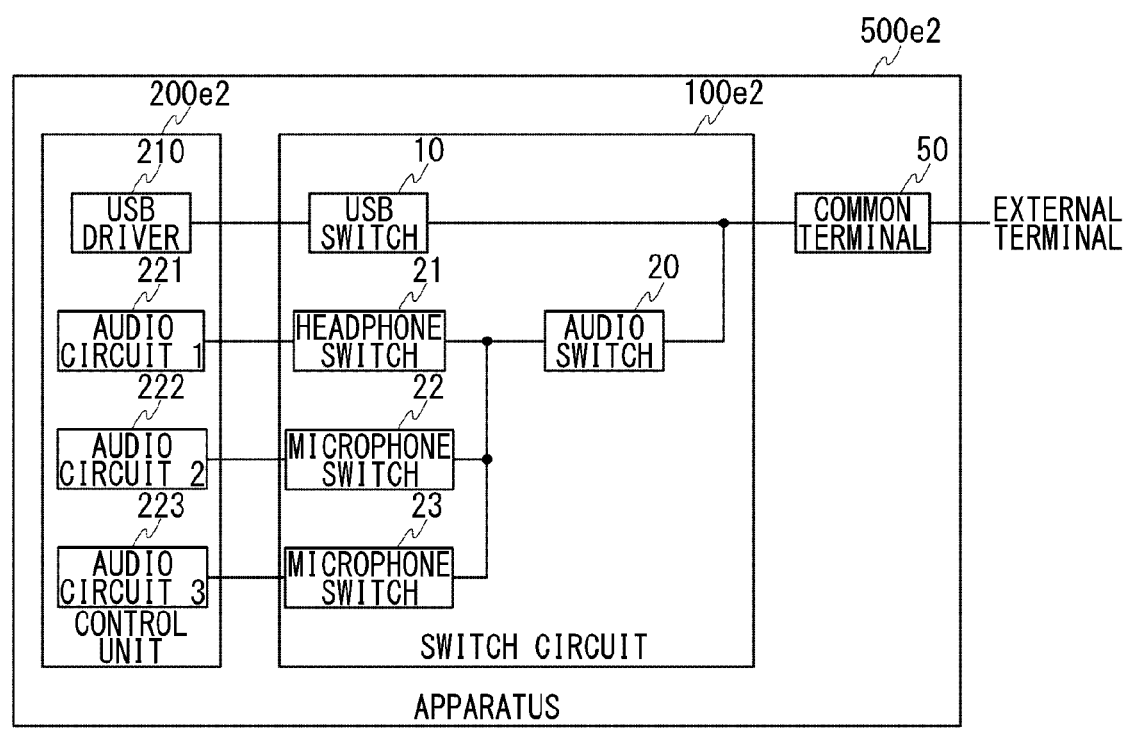
FIG. 3 is a block diagram for explaining a switch circuit according to a second embodiment of the present invention.

FIG. 2 is a block diagram for explaining a switch circuit 100e1 according to a first embodiment of the present invention. An apparatus 500e1 includes a control unit 200e1, a switch circuit 100e1, and a common terminal (port) 50. The control unit 200e1 includes a USB driver 210, an audio circuit 1 (221), and an audio circuit 2 (222). The switch circuit 100e1 includes a USB switch 10, an audio switch 20, a headphone switch 21, and a microphone switch 22.

The common terminal 50 allows the insertion of a terminal of a USB cable, a terminal of a headphone cable, or a terminal of a microphone cable in a shared manner. A signal line from the common terminal 50 is branched into two lines which are connected to one end of the USB switch 10 and one end of the audio switch 20 which is a primary hierarchical switch of the audio signal switch, respectively. A signal line from the other end of the USB switch 10 is connected to the USB driver 210.

A signal line from the other end of the audio signal switch 20 in a primary hierarchical position is branched into a plurality of lines (two lines in the case of FIG. 2), and the respective plurality of lines (two lines in the case of FIG. 2) are connected to one ends of the headphone switch 21 and the microphone switch 22 which are secondary hierarchical switches of the audio signal switch. A signal line from the other end of the headphone switch 21 is connected to the audio circuit 1 (221), whereas a signal line from the other end of the microphone switch 22 is connected to the audio circuit 2 (222).

FIG. 3 is a block diagram for explaining a switch circuit 100e2 according to a second embodiment of the present invention. As compared with the first embodiment, the configuration of the switch circuit 100e2 according to the second embodiment is such that another audio circuit is added. The added audio circuit may be a circuit that processes audio signals complying with another standard. Though, as compared with the first embodiment, another microphone switch is added in the second embodiment, the configuration may be such that another headphone switch is added. Also, the configuration may be such that the added switch is a switch which is inserted to a dedicated wiring of audio signals and used to transmit and receive audio signals to and from an external device (e.g., personal computer (PC)).

The apparatus 500e2 includes a control unit 200e2, a switch circuit 100e2, and a common terminal (port) 50. The control unit 200e2 includes a USB driver 210, an audio circuit 1 (221), an audio circuit 2 (222), and an audio circuit 3 (223). The switch circuit 100e2 includes a USB switch 10, an audio switch 20, a headphone switch 21, a microphone switch 22, and a microphone switch 23.

The common terminal 50 allows the insertion of a terminal of a USB cable, a terminal of a headphone cable, or a terminal of a microphone cable in a shared manner. A signal line from the common terminal 50 is branched into two lines which are connected to one end of the USB switch 10 and one end of the audio switch 20 which is a primary hierarchical switch of the audio signal switch, respectively. A signal line from the other end of the USB switch 10 is connected to the USB driver 210.

A signal line from the other end of the audio signal switch 20 in the primary hierarchical position is branched into a plurality of lines (three lines in the case of FIG. 3), and the respective plurality of lines (three lines in the case of FIG. 3) are connected to one ends of the headphone switch 21, the microphone switch 22, and the microphone switch 23 which are secondary hierarchical switches of the audio signal switch. A signal line from the other end of the headphone switch 21 is connected to the audio circuit 1 (221). A signal line from the other end of the microphone switch 22 is connected to the audio circuit 2 (222). And a signal line from the other end of the microphone switch 23 is connected to the audio circuit 3 (223).

In the first and second embodiments, the capacity as seen from the signal line for USB in the switch circuits 100e1 and 100e2 is mostly the capacity of the audio switch 20. This capacity is subject to little effect of an increase of audio signal switches in a secondary hierarchical position. Therefore, it is not necessary to consider reducing the load capacity of the audio signal switches in the secondary hierarchical position as the number of them is increased. That is, it is not necessary, for instance, to make the size of the transistors used in the switches smaller in order to reduce the load capacity. In other words, an increase in the number of audio signal switches in the secondary hierarchical position does not mean a degradation in the quality of the audio signals passing through the audio signal switches.

On the other hand, if two audio signal switches are connected in series, the THD of audio signals passing through the two audio signal switches will nearly double. Yet, three or more audio signal switches are not connected in series even when there is an increase of audio circuits and/or audio wiring.

Accordingly, connecting audio signal switches hierarchically enables retaining both the quality of audio signals passing through the audio signal switches and the quality of high-frequency signals passing through the high-frequency signal switch even when there is an increase of audio circuits and/or audio wiring.

Figure 4:
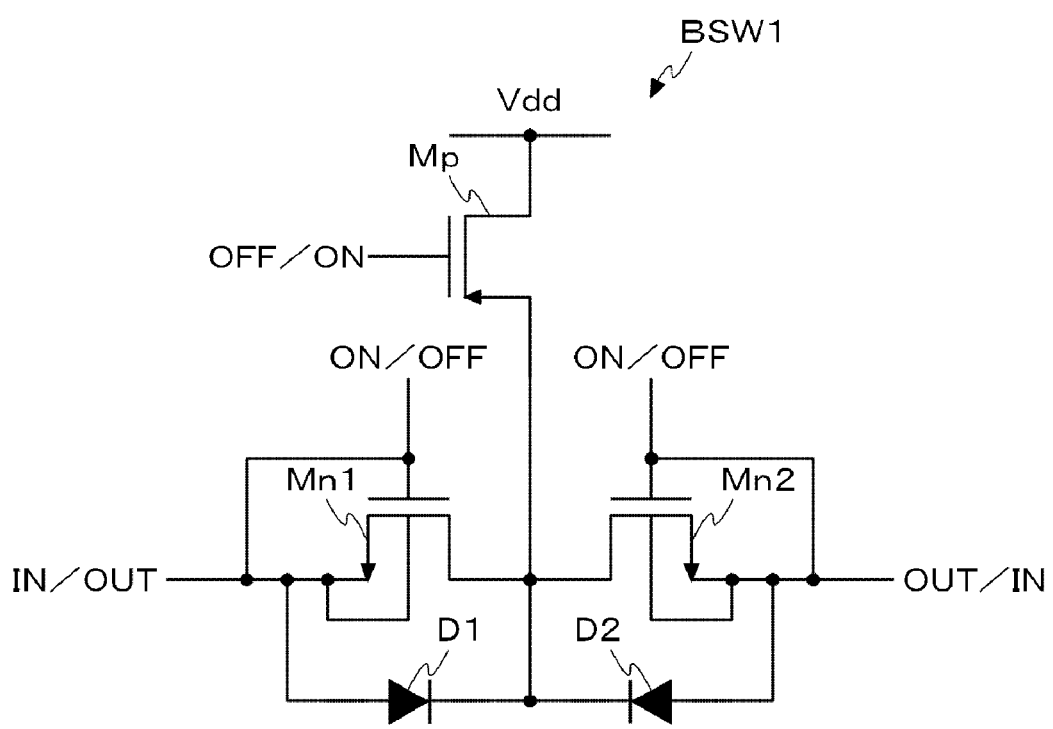
FIG. 4 is a diagram showing a first exemplary configuration of switches contained in a switch circuit according to an embodiment of the present invention.

FIG. 4 is a diagram showing a first exemplary configuration of switches contained in a switch circuit according to a preferred embodiment of the present invention. An analog audio signal has amplitude on the positive side and the negative side with 0 V (ground potential) as the base point. Hence, symmetry of passage characteristics on the positive side and the negative side is required. Generally, a high-level voltage (e.g., supply potential) as the on-signal and a low-level voltage (e.g., ground potential) as the off-signal are applied to the gate terminal of a MOSFET used in a switch (n-channel MOSFET assumed here).

The MOSFET has such characteristics that, along with a rise in source voltage, a threshold voltage Vt rises, too, and a source-drain impedance grows larger. As a result, the amplitude on the positive side of an analog audio signal is more susceptible to distortion than the amplitude on the negative side thereof.

A configuration to counter this is employed as follows. That is, the gate terminal and the source terminal are so connected as to enable coordinated operation and, furthermore, the back gate terminal and the source terminal are connected to each other in order to suppress the variation in the threshold voltage Vt by fixing the gate-source voltage and the back gate-source voltage. Nevertheless, connection between the back gate terminal and the source terminal results in the formation of a parasitic diode between the source and the drain. Since this parasitic diode is formed in the forward direction from the source to the drain, the input signals from the source toward the drain cannot be blocked off.

Based on the above-described conditions, a description will be given of a first bidirectional switch BSW1 of the first exemplary configuration shown in FIG. 4. The first bidirectional switch BSW1 is constructed by connecting two MOSFETs in series to make it possible to block off the input signals from the source toward the drain, that is, to enable the use of this switch as a bidirectional switch.

In the first exemplary configuration, the first bidirectional switch BSW1 is constructed by connecting a drain terminal of a first n-channel MOSFET (Mn1) to a drain terminal of a second n-channel MOSFET (Mn2). Also, a gate terminal and a source terminal of the first n-channel MOSFET (Mn1) are connected to each other. Note, however, that while FIG. 4 depicts a configuration of both the terminals connected directly, these two terminals are, in reality, connected to each other through the intermediary of capacitance and other elements. A back gate terminal and the source terminal of the first n-channel MOSFET (Mn1) are connected to each other. This results in the formation of a first parasitic diode D1 between the source terminal and the drain terminal of the first n-channel MOSFET (Mn1). The first parasitic diode D1 will have an anode on a source terminal side thereof and a cathode on the drain terminal side thereof.

The second n-channel MOSFET (Mn2) is of the same connection configuration as the first n-channel MOSFET (Mn1). Therefore, a second parasitic diode D2 is formed between the source terminal and the drain terminal of the second n-channel MOSFET (Mn2).

A p-channel MOSFET (Mp) is inserted between the connection point of the drain terminal of the first n-channel MOSFET (Mn1) and the drain terminal of the second n-channel MOSFET (Mn2) and the supply potential. A source terminal of the p-channel MOSFET (Mp) is connected to the above-mentioned connection point, a drain terminal thereof is connected to the supply potential, and a gate terminal thereof receives switching signals.

When the first bidirectional switch BSW1 is controlled to be on, an on-signal (high-level voltage) is inputted to the respective gate terminals of the first n-channel MOSFET (Mn1) and the second n-channel MOSFET (Mn2), and an off-signal (high-level voltage) is inputted to the gate terminal of the p-channel MOSFET (Mp). On the other hand, when the first bidirectional switch BSW1 is controlled to be off, an off-signal (low-level voltage) is inputted to the respective gate terminals of the first n-channel MOSFET (Mn1) and the second n-channel MOSFET (Mn2), and an on-signal (low-level voltage) is inputted to the gate terminal of the p-channel MOSFET (Mp).

The first bidirectional switch BSW1 is of such configuration that the cathodes of the first parasitic diode D1 and the second parasitic diode D2 face each other. Therefore, there is no flow of electric current across the first bidirectional switch BSW1 in either direction through the first parasitic diode D1 and the second parasitic diode D2 when the first n-channel MOSFET (Mn1) and the second n-channel MOSFET (Mn2) are in the off state. Also, when the first bidirectional switch BSW1 is controlled to be off, there will be the supply potential at the cathode by the operation of the p-channel MOSFET (Mp). Therefore, there will be no flow of electric current unless voltage higher than the supply voltage is inputted to the anode of the first parasitic diode D1 or the anode of the second parasitic diode D2.

Figure 5:
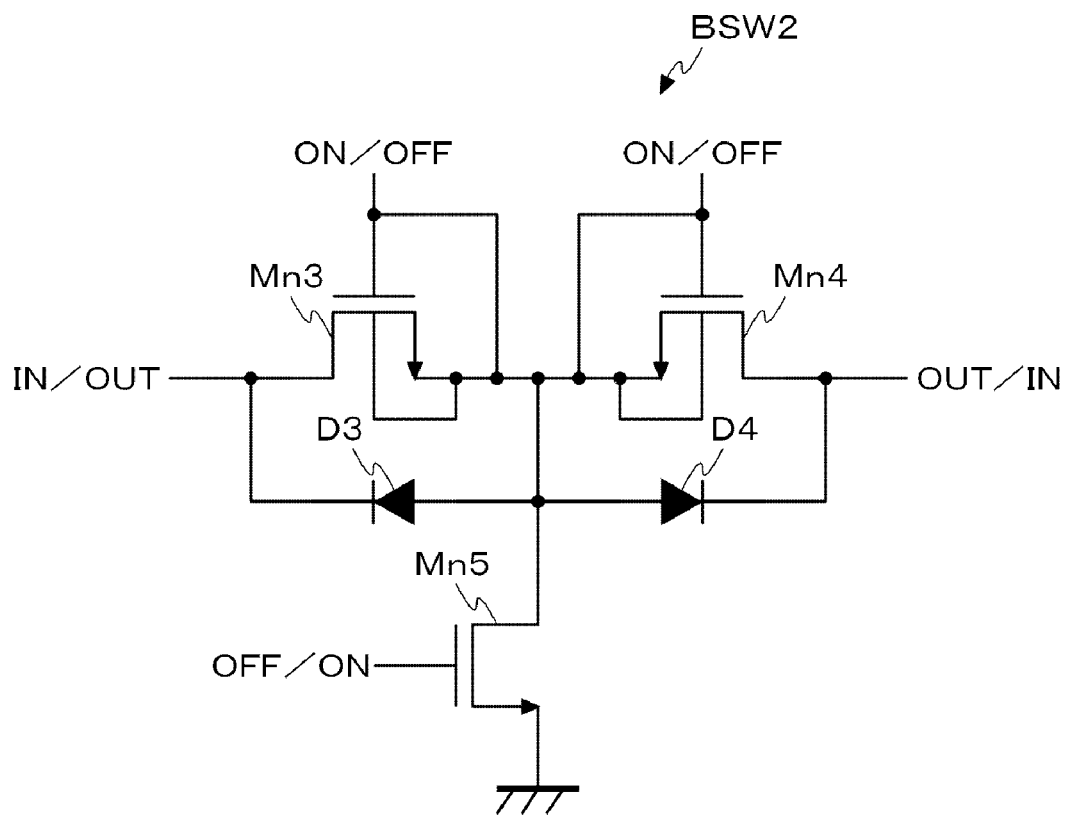
FIG. 5 is a diagram showing a second exemplary configuration of switches contained in a switch circuit according to an embodiment of the present invention.

FIG. 5 is a diagram showing a second exemplary configuration of switches contained in a switch circuit according to an embodiment of the present invention. In the second exemplary configuration shown in FIG. 5, too, a second bidirectional switch BSW2 is configured by connecting two MOSFETs in series with each other.

In the second exemplary configuration, the second bidirectional switch BSW2 is constructed by connecting a source terminal of a third n-channel MOSFET (Mn3) to a source terminal of a fourth n-channel MOSFET (Mn4). The gate terminal and the source terminal of the third n-channel MOSFET (Mn3) are so connected as to enable coordinated operation and, furthermore, a back gate terminal and the source terminal of the third n-channel MOSFET (Mn3) are connected to each other. This results in the formation of a third parasitic diode D3 between the source terminal and the drain terminal of the third n-channel MOSFET (Mn3). The third parasitic diode D3 will have an anode on a source terminal side thereof and a cathode on the drain terminal side thereof. Note, however, that while FIG. 5 depicts a configuration of the gate terminal and the source terminal of the third n-channel MOSFET (Mn3) are connected directly to each other, these two terminals are, in reality, connected to each other through the intermediary of capacitance and other elements.

A fourth n-channel MOSFET (Mn4) is of the same connection configuration as the third n-channel MOSFET (Mn3). Therefore, a fourth parasitic diode D4 is formed between a source terminal and a drain terminal of the fourth n-channel MOSFET (Mn4).

A fifth n-channel MOSFET (Mn5) is inserted between the connection point of the source terminal of the third n-channel MOSFET (Mn3) and the source terminal of the fourth n-channel MOSFET (Mn4) and the ground potential. A source terminal of the fifth n-channel MOSEFT (Mn5) is connected to the ground potential, a drain terminal thereof is connected to the above-mentioned connection point, and a gate terminal thereof is receives switching signals.

When the second bidirectional switch BSW2 is controlled to be on, an on-signal (high-level voltage) is inputted to the respective gate terminals of the third n-channel MOSFET (Mn3) and the fourth n-channel MOSFET (Mn4), and an off-signal (low-level voltage) is inputted to the gate terminal of the fifth n-channel MOSFET (Mn5). On the other hand, when the second bidirectional switch BSW2 is controlled to be off, an off-signal (low-level voltage) is inputted to the respective gate terminals of the third n-channel MOSFET (Mn3) and the fourth n-channel MOSFET (Mn4), and an on-signal (high-level voltage) is inputted to the gate terminal of the fifth n-channel MOSFET (Mn5).

The second bidirectional switch BSW2 is of such configuration that the anodes of the third parasitic diode D3 and the fourth parasitic diode D4 face each other. Therefore, there is no flow of electric current across the second bidirectional switch BSW2 in either direction through the third parasitic diode D3 and the fourth parasitic diode D4 when the third n-channel MOSFET (Mn3) and the fourth n-channel MOSFET (Mn4) are in the off state. Also, when the second bidirectional switch BSW2 is controlled to be off, there will be the ground potential at the anode by the operation of the fifth n-channel MOSEFT (MN5). Therefore, there will be no flow of electric current unless voltage lower than the ground voltage is inputted to the cathode of the third parasitic diode D3 or the cathode of the fourth parasitic diode D4.

The first bidirectional switch BSW1 and the second bidirectional switch BSW2 according to the first exemplary configuration and the second exemplary configuration, respectively, can switch the input signals in both directions and can suppress the distortion of the analog audio signals. Thus, the first bidirectional switch BSW1 and the second bidirectional switch BSW2 are suitable for the switches included in the switch circuit according to the embodiments of the present invention.

Figure 6:
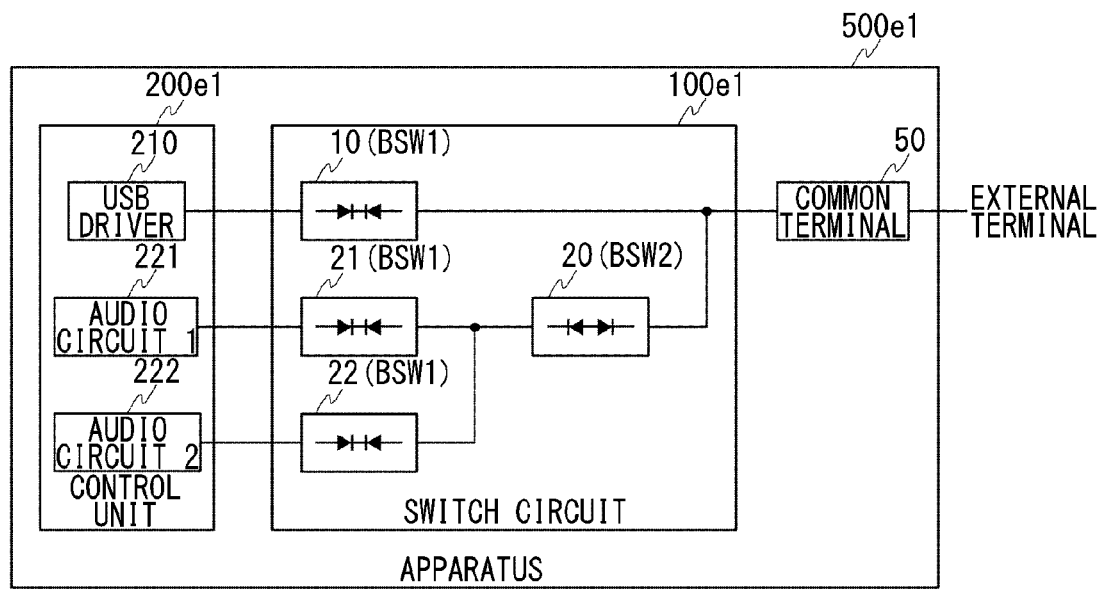
FIG. 6 shows an example of the application of a first bidirectional switch and a second bidirectional switch to switches included in a switch circuit according to a first embodiment of the present invention.

FIG. 6 shows an example of the application of the first bidirectional switch BSW1 and the second bidirectional switch BSW2 to the switches included in the switch circuit 100e1 according to the first embodiment of the present invention. When the bidirectional switch BSW1 is in the off state, an intermediate node potential between two MOSFETs is clamped to the supply potential. On the other hand, when the bidirectional switch BSW2 is in the off state, the intermediate node potential between two MOSFETs is clamped to the ground potential.

In the switch circuit 100e1, the first bidirectional switch BSW1 is used for the high-frequency signal switch (the USB switch 10 in FIG. 6). The second bidirectional switch BSW2 is used for the audio signal switch in the primary hierarchical switch (the audio switch 20 in FIG. 6), and the first bidirectional switch BSW1 is used for the secondary hierarchical switches (the headphone switch 21 and the microphone switch 22).

Since the first bidirectional switch BSW1 is used for the secondary hierarchical switches, the reverse flow of signals between the audio circuit 1 (221) and the audio circuit 2 (222) can be reliably prevented. Assume herein, for example, that the audio circuit 1 (221) is connected to an external terminal. In this case, the USB switch 10 is turned off, both the audio switch 20 and the headphone switch 21 on, and the microphone switch 22 off. Then, the intermediate node in the first bidirectional switch BSW1 of the microphone switch 22 is clamped to the supply potential. Thus, no signals serving as noise flows from the microphone switch 22 unless voltage higher than the supply voltage is inputted to the headphone switch 21.

If the second bidirectional switch BSW2 is applied to the secondary hierarchical switches of the audio signal switch, there will be a concern as follows. Assume herein, for example, that the audio circuit 1 (221) is connected to an external terminal. In this case, the USB switch 10 is turned off, both the audio switch 20 and the headphone switch 21 on, and the microphone switch 22 off. Then, the intermediate node in the second bidirectional switch BSW2 of the microphone switch 22 is clamped to the ground potential. Further, the audio signal is of a waveform with 0 V in the center (i.e., the waveform having the positive potential and the negative potential). Thus, when the negative potential is inputted to the headphone switch 21, a current serving as noise flows through a diode in the second bidirectional switch BSW2 of the microphone switch 22 (the third parasitic diode D3 or the fourth parasitic diode D4). As a result, the negative potential of the headphone switch 21 is pulled up to a ground potential side, thereby increasing the THD of audio signals passing through the headphone switch 21.

In the present embodiment, the capacity of the primary hierarchical switch of the audio signal switch dominates the capacity as seen from the signal line for USB in the high-frequency signal switch. Since, instead of the first bidirectional switch BSW1 of the high-frequency signal switch, the second bidirectional switch BSW2 is used for the first hierarchical switch of the audio signal switch, the capacity as seen from the signal line for USB is more reduced than when the first bidirectional switch BSW1 is used for the first hierarchical switch.

When the primary hierarchical switch is used for the second bidirectional switch BSW2, the drain terminal of the second bidirectional switch BSW2 is connected to the signal line for USB. Thus, the capacity caused by the drain terminal (capacity between an impurity region constituting the drain terminal and an impurity region constituting the back-gate terminal) is a main part of the capacity as seen from the signal line for USB.

On the other hand, when the primary hierarchical switch is the first bidirectional switch BSW1, the drain terminal of the first bidirectional switch BSW1 is further connected to the back-gate terminal. Thus, the capacities caused by the back-gate terminal (capacity between an impurity region constituting the back-gate terminal and a well region, where this impurity region is formed, or a substrate, capacity between an impurity region constituting the back-gate terminal and an impurity region constituting the drain terminal, and capacity between an impurity region constituting the back-gate terminal and the gate terminal) is a main part of the capacity as seen from the signal line for USB.

By taking these factors into consideration in the present embodiment, the second bidirectional switch BSW2 is used for the first hierarchical switch of the audio signal switch, instead of the case where the first bidirectional switch BSW1 of the high-frequency signal switch is used therefor.

In the application example described in conjunction with FIG. 6, a description has been given of an example where the first bidirectional switch BSW1 is used for the USB switch 10, the headphone switch 21, and the microphone switch 22. It goes without saying that the specifications (e.g., the gate width) of the first bidirectional switches BSW1 used for the respective switches differs depending on the signals passing through the respective switches and the specifications of circuits to and from which the signals passing through these switches are inputted and outputted.

By employing the present embodiment, the audio signal switches are hierarchized when the signal line carrying the high-frequency signals and a plurality of signal lines carrying the audio signals are used by joining them together. Thus, distortion components occurring in the high-frequency signals and the audio signals can be suppressed. This proves an efficient technique particularly when an increased larger number of signal lines carrying the audio signals are used.

The present invention has been described based on illustrative embodiments. These embodiments are intended to be illustrative only and it will be obvious to those skilled in the art that various modifications to constituting elements and processes could be further developed and that such additional modifications are also within the scope of the present invention.

In conjunction with FIG. 6, a description has been given of an example where the second bidirectional switch BSW2 is used for the audio switch 20. In this regard, a single-directional switch may also be used for the audio switch 20.

Figure 7:
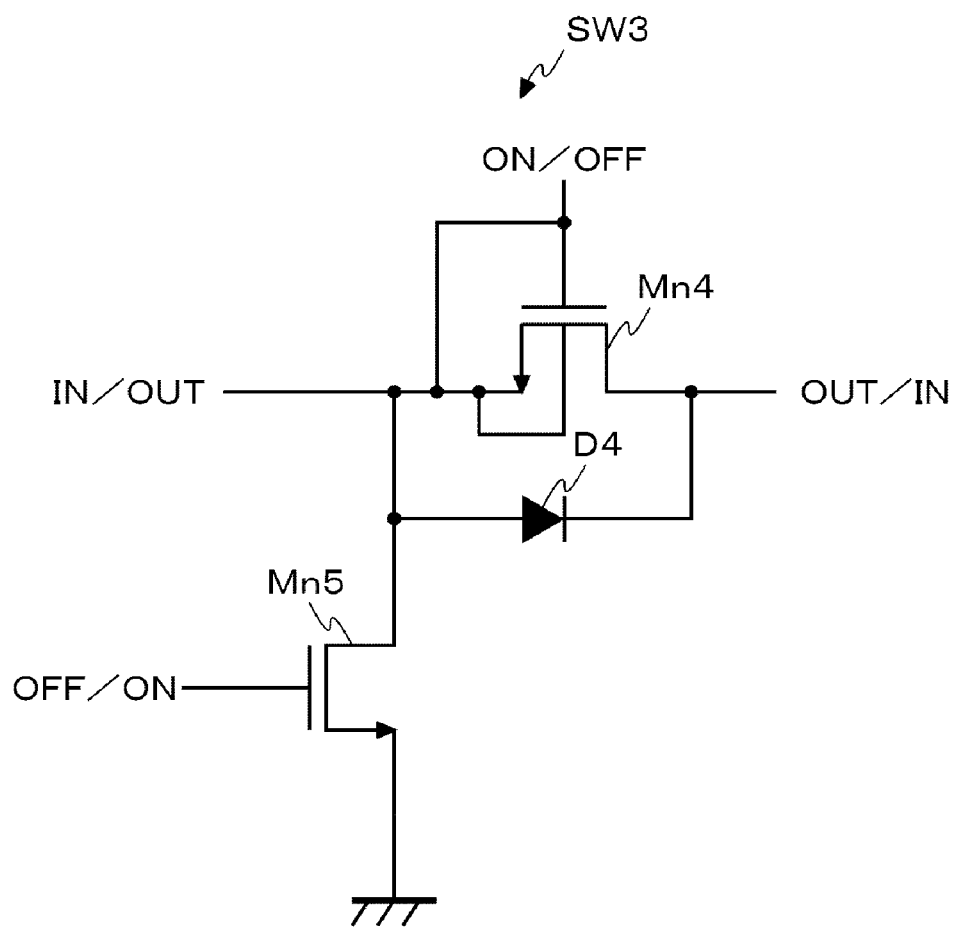
FIG. 7 is a diagram showing a third exemplary configuration of switches contained in a switch circuit according to an embodiment of the present invention.

FIG. 7 is a diagram showing a third exemplary configuration of switches applicable to a switch circuit according to an embodiment of the present invention. A switch SW3 according to the third exemplary configuration is configured such that the third n-channel MOSFET (Mn3) is removed from the second bidirectional switch BSW2 shown in FIG. 5.

Figure 8:
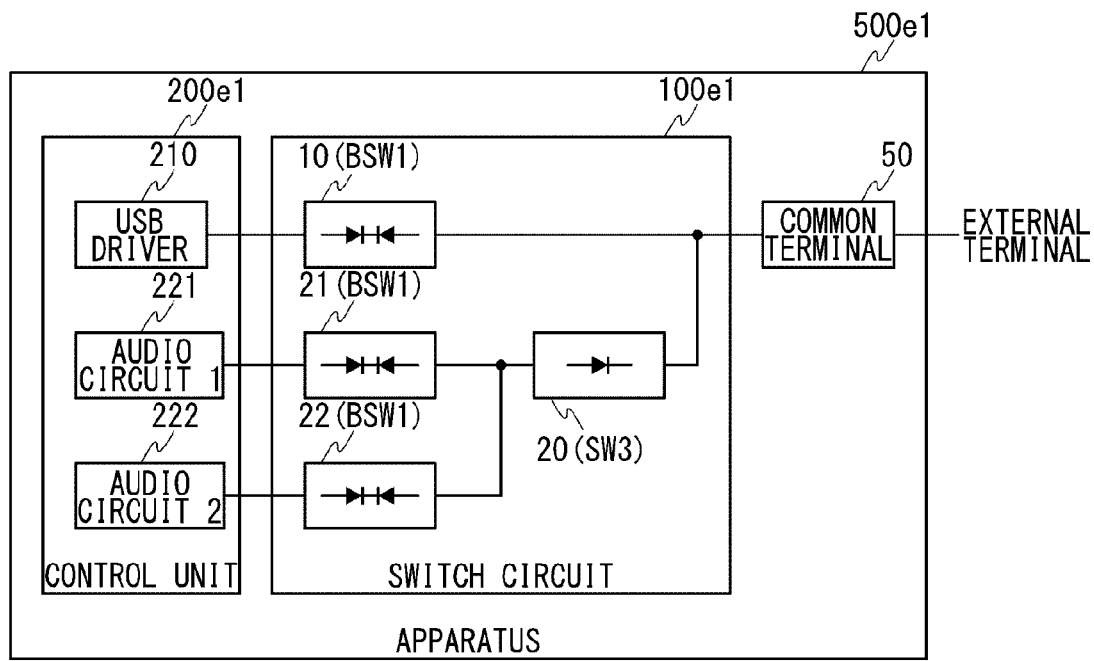
FIG. 8 shows an example of the application of a first bidirectional switch and a third switch to switches included in a switch circuit according to a first embodiment of the present invention.

FIG. 8 shows an example of the application of the first bidirectional switch SBW1 and the third switch SW3 to the switches included in the switch circuit 100e1 according to the first embodiment of the present invention. In conjunction with FIG. 6, a description has been given of an example where the second bidirectional switch BSW2 is applied to the audio switch 20. This example is more advantageous than an example where the first directional switch BSW1 is used for the audio switch 20. However, this example, which uses two MOSFETs, has an extra impedance from the common terminal 50 up to the audio circuit, as compared with the case where a single MOSFET is used.

Thus, the third switch SW3 shown in FIG. 7 is applied to the audio switch 20. As a result, the on-resistance of the audio switch 20 can be further reduced. Though the switch SW3 alone cannot block a negative signal inputted to the audio circuit 1 (221) or the audio circuit 2 (222) from the external terminal, this negative signal can be blocked by the first bidirectional switch BSW1 applied to the headphone switch 21 and the microphone switch 22. A signal outputted to the external terminal from the audio circuit 1 (221) or the audio circuit 2 (222) can also be blocked by the first bidirectional switch BSW1 applied to the headphone switch 21 and the microphone switch 22.

In the above-described embodiments, descriptions have been given of examples where the switch circuits 100e1 and 100e2 are mounted on the mobile devices such as mobile phones. However, in the light of the refinement of design and the prevention of false insertion and the like, the present embodiments are applicable to not only portable devices but also all sorts of electronic devices and equipment n the above-described embodiments, descriptions have been given of examples where the switch circuits 100e1 and 100e2 are mounted on the mobile devices such as mobile phones. However, in the light of the refinement of design and the prevention of false insertion and the like, the present embodiments are applicable to not only portable devices but also all sorts of electronic devices and equipment as long as a connector is simplified.

What is claimed is:

1. A switch circuit to be mounted in a device having a common terminal which allows insertion of a terminal of a cable for transmitting high-frequency signals and insertion of a terminal of a cable dedicated to the transmission of audio signals, the switch circuit comprising:

a high-frequency signal switch capable of switching between passage and no passage of high-frequency signals, wherein the high-frequency signal switch comprises a pair of series connected MOSFETs; and a bidirectional audio signal switch dedicated to switching between passage and no passage of audio signals, wherein the bidirectional audio signal switch comprises a pair of series connected MOSFETs, wherein a signal line from the common terminal is branched into one line connected to one end of said high-frequency signal switch and another line connected to one end of an audio signal switch in a primary hierarchical position, wherein a signal line from the other end of said high-frequency signal switch is connected to a target circuit, and wherein a signal line from the other end of the audio signal switch in the primary hierarchical position is branched into a plurality of lines, the respective plurality of lines are connected to one end of a plurality of audio signal switches in a secondary hierarchical position, the respective signal lines from the other end of the plurality of audio signal switches in the secondary hierarchical position are connected to respective target circuits, the high-frequency signal switch is of a first type having a center potential that is clamped to a supply voltage when the high-frequency signal switch is in an off state and not allowing passage of the high-frequency signals and disconnected from the supply voltage when in the high-frequency signal switch is in an on state and allowing passage of the high-frequency signals, and wherein the audio signal switch is of a second type having a center potential than is clamped to a ground when in an off state and disconnected from ground when in an on state and allowing passage of the audio signals.

2. A switch circuit according to claim 1, wherein said high-frequency signal switch and said audio signal switch are each a bidirectional switch of two MOSFETs (metal-oxide-semiconductor field-effect transistors) connected in series, and wherein the pair of MOSFETs of the high-frequency signal switch have each a source terminal, a gate terminal, and a back gate terminal thereof connected with each other and are connected such that cathodes of parasitic diodes provided respectively for the two MOSFETs face each other, and wherein a third MOSFET of the high-frequency signal switch has a source connected to the cathodes of the pair of MOSFETs of the high-frequency signal switch and a drain connected to a supply voltage and a gate terminal that is driven such that when the gates of the pair of MOSFETs are low the gate of the third MOSFET is high and when the gates of the two MOSFETs are high the gate of the third MOSFET is low.

3. A switch circuit according to claim 2, wherein the pair of MOSFETs constituting said audio signal switch have each the source terminal and the back gate terminal thereof connected with each other, and wherein the pair of MOSFETs constituting said audio signal switch in the primary hierarchical position have each the source terminal, a gate terminal, and the back gate terminal thereof connected with each other, and the pair of MOSFETs are connected such that anodes of parasitic diodes provided respectively for the two MOSFETs face each other, wherein a third MOSFET of the audio signal switch has a drain connected to the anodes of the pair of MOSFETs and a source connected to a ground and a gate terminal that is driven such that when the gates of the pair of MOSFETs are low the gate of the third MOSFET is high and when the gates of the pair of MOSFETs are high the gate of the third MOSFET is low.

4. A switch circuit according to claim 1, wherein the common terminal is a terminal included in a universal serial bus (USB) connector, and wherein said high-frequency signal switch is a USB switch provided on a USB signal line.

5. The switch circuit of claim 1, wherein the high-frequency signal switch comprises:
first, second, and third metal-oxide-semiconductor field-effect transistors (MOSFETs);
the first and second MOSFETs being N-type MOSFETs and each having a source terminal, a gate terminal, and a back gate terminal connected together, and wherein the first MOSFET has a drain connected to a drain of the second MOSFET, the first and second MOSFETs are connected such that cathodes of parasitic diodes provided respectively for the first and second MOSFETs face each other; and
the third MOSFET is a P-type MOSFET having a source connected to the cathodes of the first and second MOSFETs and a drain connected to a supply voltage.

6. The switch circuit of claim 1, wherein the audio signal switch comprises:
first, second, and third metal-oxide-semiconductor field-effect transistors (MOSFETs);
the first and second MOSFETs being N-type MOSFETs and each having a source terminal, a gate terminal, and a back gate terminal connected together, and wherein the first MOSFET has a drain connected to a drain of the second MOSFET, the first and second MOSFETs are connected such that anodes of parasitic diodes provided respectively for the first and second MOSFETs face each other; and
the third MOSFET is a N-type MOSFET having a source connected to the anodes of the first and second MOSFETs and a drain connected to a ground.

7. The switch circuit of claim 1, wherein the audio signal switch comprises:
a first N-type MOSFET having a source that is connected to the plurality of lines and is connected to a gate and a back-gate, and a drain connected to the common terminal, wherein a parasitic diode of the first N-type MOSFET has a cathode connected to its drain and an anode connected to its source; and
a second N-type MOSFET having a drain connected to the source of the first N-type MOSFET and a drain connected to the ground.

8. The switch circuit of claim 1, wherein the respective target circuits include two audio circuits that comply with different standards.

9. The switch circuit of claim 1, wherein the plurality of audio signal switches in the secondary hierarchical position include a headphone switch and a microphone switch.

10. A switch circuit for reducing harmonic distortion of a high-frequency signal, comprising:
a high-frequency signal switch having a first end connected to a common terminal, a second end connected to a high-frequency target circuit, and a center potential that is clamped to a supply voltage when the high-frequency signal switch is off and disconnected therefrom when the high-frequency signal switch is on wherein the high-frequency signal switch comprises a pair of series connected MOSFETs; and
an audio signal switch in a primary hierarchical position and having one end connected to the common terminal, a second end connected to a plurality of audio signal switches in a secondary hierarchical position, the audio signal switch comprises a pair of series connected MOSFETs and a metallic-oxide semiconductor field effect transistor (MOSFET) that connects the audio signal switch to a ground when the audio signal switch is off and disconnected the audio signal switch therefrom when the audio signal switch is on;
wherein each of the plurality of audio signal switches in the secondary hierarchical position is connected to a respective target circuit.

11. The switch circuit of claim 10, wherein the high-frequency signal switch comprises:
first and second MOSFETs connected in series, each having a source terminal, a gate terminal, and a back gate terminal thereof connected with each other, and each forming a parasitic diode between the source terminal and a drain terminal, the first and second MOSFETs are connected such that cathodes of the parasitic diodes face each other, and
a third MOSFET that has a source terminal connected to the cathodes of the parasitic diodes of the first and second MOSFETs and a drain connected to the supply voltage;
wherein a gate terminal of the third MOSFET is driven such that when the gates of the first and second MOSFETs are low the gate of the third MOSFET is high and when the gates of the first and second MOSFETs are high the gate of the third MOSFET is low.

12. The switch circuit of claim 10, wherein the audio signal switch comprises:
first and second MOSFETs connected in series, each having a source terminal, a gate terminal, and a back gate terminal thereof connected with each other, and each forming a parasitic diode between the source terminal and a drain terminal, the first and second MOSFETs are connected such that anodes of the parasitic diodes face each other, and
a third MOSFET that has a source terminal connected to the anodes of the parasitic diodes of the first and second MOSFETs and a drain connected to the ground;
wherein a gate terminal of the third MOSFET is driven such that when the gates of the first and second MOSFETs are low the gate of the third MOSFET is high and when the gates of the first and second MOSFETs are high the gate of the third MOSFET is low.

13. The switch circuit of claim 10, wherein the audio signal switch comprises:
a first MOSFET having a source that is connected to the plurality of audio signal switches and is connected to a gate and a back-gate, and a drain connected to the common terminal, wherein a parasitic diode of the first MOSFET has a cathode connected to its drain and an anode connected to its source; and
a second MOSFET having a drain connected to the source of the first MOSFET and a drain connected to the ground.

14. The switch circuit of claim 10, wherein each of the plurality of audio signal switches in the secondary hierarchical position comprises:
first and second MOSFETs connected in series, each having a source terminal, a gate terminal, and a back gate terminal thereof connected with each other, and each forming a parasitic diode between the source terminal and a drain terminal, the source terminal of the first MOSFET connected to the audio signal switch in the primary hierarchical position and the source terminal of the second MOSFET connected to the respective target circuit, the first and second MOSFETs are connected such that cathodes of the parasitic diodes face each other, and
a third MOSFET that has a source terminal connected to the cathodes of the parasitic diodes of the first and second MOSFETs and a drain connected to the supply voltage;
wherein a gate terminal of the third MOSFET is driven such that when the gates of the first and second MOSFETs are low the gate of the third MOSFET is high and when the gates of the first and second MOSFETs are high the gate of the third MOSFET is low.

15. The switch circuit of claim 10, wherein the common terminal is a terminal included in a universal serial bus (USB) connector, and wherein said high-frequency signal switch is a USB switch provided on a USB signal line.

16. A mobile phone, comprising:
a port, having a common terminal, that allows insertion of anyone of a terminal of a universal serial bus (USB) cable, a terminal of a headphone cable, or a terminal of a microphone in a shared manner;
a high-frequency signal switch having a first end connected to the common terminal, a second end connected to a high-frequency target circuit, and a center potential that is clamped to a supply voltage when the high-frequency switch is off and disconnected therefrom when the high-frequency signal switch is on, wherein:
the high-frequency signal switch comprises a first and second series connected MOSFETs with a pair of commonly coupled nodes clamped to one of ground or a supply; and
an audio signal switch in a primary hierarchical position and having one end connected to the common terminal, a second end connected to a plurality of audio signal switches in a secondary hierarchical position, and a metallic-oxide semiconductor field effect transistor (MOSFET) that connects the audio signal switch to a ground when the audio signal switch is off and disconnected the audio signal switch therefrom when the audio signal switch is on; and
wherein each of the plurality of audio signal switches in the secondary hierarchical position is connected to a respective target circuit; and
the audio signal switches comprises first and second series connected MOSFETs having commonly connected drain terminals or commonly connected source terminal selectively clamped to one of a supply and ground one of a supply and ground.

17. The mobile phone of claim 16, wherein the high-frequency signal switch comprises:
the first and second MOSFETs connected in series, each having a source terminal, a gate terminal, and a back gate terminal thereof connected with each other, and each forming a parasitic diode between the source terminal and a drain terminal, the first and second MOSFETs are connected such that cathodes of the parasitic diodes face each other, and
the third MOSFET that has a source terminal connected to the cathodes of the parasitic diodes of the first and second MOSFETs and a drain connected to the supply voltage;
wherein a gate terminal of the third MOSFET is driven such that when the gates of the first and second MOSFETs are low the gate of the third MOSFET is high and when the gates of the first and second MOSFETs are high the gate of the third MOSFET is low.

18. The mobile phone of claim 16, wherein the audio signal switch comprises:
first and second MOSFETs connected in series, each having a source terminal, a gate terminal, and a back gate terminal thereof connected with each other, and each forming a parasitic diode between the source terminal and a drain terminal, the first and second MOSFETs are connected such that anodes of the parasitic diodes face each other, and
a third MOSFET that has a source terminal connected to the anodes of the parasitic diodes of the first and second MOSFETs and a drain connected to the ground;
wherein a gate terminal of the third MOSFET is driven such that when the gates of the first and second MOSFETs are low the gate of the third MOSFET is high and when the gates of the first and second MOSFETs are high the gate of the third MOSFET is low.

19. The mobile phone of claim 16, wherein the audio signal switch comprises:
a first MOSFET having a source that is connected to the plurality of audio signal switches and is connected to a gate and a back-gate, and a drain connected to the common terminal, wherein a parasitic diode of the first MOSFET has a cathode connected to its drain and an anode connected to its source; and a second MOSFET having a drain connected to the source of the first MOSFET and a drain connected to the ground.

\* \* \* \* \*